US010274721B2

(12) United States Patent
Ohl et al.

(10) Patent No.: US 10,274,721 B2
(45) Date of Patent: Apr. 30, 2019

(54) MICROMECHANICAL DEVICE INCLUDING A MOVABLE ELEMENT HAVING A LASER DISPOSED THEREON

(71) Applicant: Robert Bosch GmbH, Stuttgart (DE)

(72) Inventors: Christian Ohl, Pfullingen (DE); Florian Grabmaier, Tuebingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 15/374,175

(22) Filed: Dec. 9, 2016

(65) Prior Publication Data
US 2017/0168290 A1    Jun. 15, 2017

(30) Foreign Application Priority Data
Dec. 10, 2015 (DE) .................. 10 2015 224 812

(51) Int. Cl.
*G02B 26/08* (2006.01)
*G02B 26/10* (2006.01)
*H01S 5/183* (2006.01)
*H01S 5/00* (2006.01)

(52) U.S. Cl.
CPC ......... *G02B 26/0833* (2013.01); *G02B 26/10* (2013.01); *G02B 26/105* (2013.01); *H01S 5/183* (2013.01); *H01S 5/0071* (2013.01)

(58) Field of Classification Search
CPC .. G02B 26/0833; G02B 26/10; G11B 7/1362; G11B 7/123; H01S 5/183
USPC ........................................ 359/224.1
See application file for complete search history.

(56) References Cited

U.S. PATENT DOCUMENTS

| 6,215,738 B1* | 4/2001 | Richter | G11B 7/1362 369/119 |
| 6,657,927 B1* | 12/2003 | Awano | G11B 7/1362 369/13.23 |
| 7,324,425 B2* | 1/2008 | Matsui | G11B 7/1362 369/112.29 |
| 2013/0039374 A1* | 2/2013 | Lutgen | H01S 5/02288 372/43.01 |
| 2013/0321890 A1* | 12/2013 | Ishida | G02B 27/0172 359/200.7 |

* cited by examiner

*Primary Examiner* — Euncha P Cherry
(74) *Attorney, Agent, or Firm* — Norton Rose Fulbright US LLP; Gerard Messina

(57) ABSTRACT

A micromechanical device is described as having a stationary element (100) and a deflectable element. The invention relates to a light source that is situated on the deflectable element. Also described is a micromechanical scanner including a micromechanical device having a movable element with a light source disposed thereon.

27 Claims, 2 Drawing Sheets

MICROMECHANICAL DEVICE INCLUDING A MOVABLE ELEMENT HAVING A LASER DISPOSED THEREON

FIELD OF THE INVENTION

The present invention is based on a micromechanical device having a stationary element and a deflectable element.

BACKGROUND INFORMATION

Semiconductor lasers, in particular VCSELs (vertical cavity surface emitting lasers) are known from the related art. Movable micro-mirrors are known in addition. Using a VCSEL (vertical cavity surface emitting laser) and a movable micro-mirror and a lens, it is possible to set up scanner-laser projectors and applications that measure distance and speed. However, for CE applications it is decisive that the component requires very little space (e.g., cell phone) and is cost-effective. This means that the components should be integrated into a very small package. The Twin Eye from Philips, an LCP premold housing, is a package for ASIC, VCSEL and lens currently available on the market. If a micro-mirror is to be integrated into the application, the obvious solution currently consists of placing it next to a VCSEL module. However, this requires a mounting frame on which the two components may be positioned relative to each other.

SUMMARY

The present invention is based on a micromechanical device having a stationary element and a deflectable element. In the present invention a light source is situated on the deflectable element.

In one advantageous development of the micromechanical device according to the present invention, the light source is a semiconductor light source, in particular a light-emitting diode or a semiconductor laser. In an especially preferred manner, the light source is a VCSEL.

In one advantageous development of the micromechanical device according to the present invention, a lens is disposed in front of a light-exit point of the light source, the lens being fixedly situated relative to the light source. In an advantageous manner, a collimator is able to be produced using such a lens, or a light beam is able to be focused.

In addition, the present invention relates to a micromechanical scanner having a micromechanical device including a movable element on which a light source is disposed.

In contrast to the related art, the micromechanical device according to the present invention is not used as deflection mirror which creates the scanning laser beam, but as a movable suspension for the laser. The beam is no longer moved by deflection; instead, the laser source itself is moved directly. This also makes it possible to dispense with a complex MEMS micro-mirror. A deflectable element is sufficient, such as a plate (without a mirror surface etc.), movably suspended on springs, with a metal plane thereon for the electrical contacts of the laser.

This makes it possible to save two things in comparison with a conventional design of a scanning beam. First, the complex mounting frame or the housing for the positioning of the components relative to one another can be omitted. Secondly, the MEMS element can be considerably simplified into a movable plate or into a movable frame.

This module, which has a very small design, can advantageously be used for all applications in which a scanning light beam is to be generated from a light source (e.g., laser diode, diode, VCSEL) and a movable deflection mirror. For example, typical applications are a scanning distance measurement (using VCSEL) or also a micro-projector.

DETAILED DESCRIPTION

Figure 1:
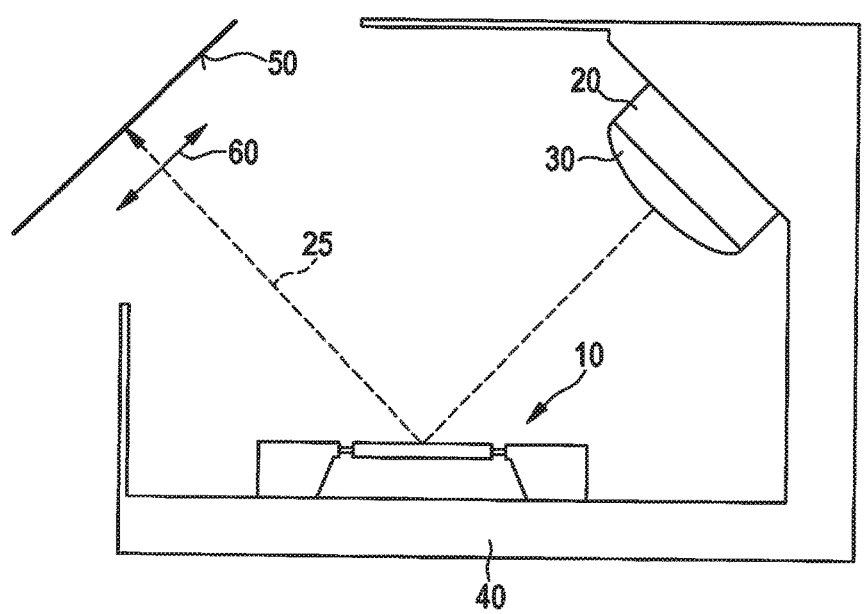
FIG. 1 shows a laser scanner having a movable micro-mirror and a separately situated laser in the related art.

FIG. 1 shows a laser scanner having a movable micro-mirror and a separately disposed laser in the related art. Shown schematically are a micro-mirror 10 as well as a laser 20, in particular a VCSEL laser, which has a collimator lens 30 in front of its light-exit opening. Micro-mirror 10 and laser 20 are situated on a mounting frame 40. Micro-mirror 10 is a micromechanical component and essentially made up of a stationary element and a deflectable element, i.e. the mirror surface. A laser beam 25 emerging from laser 20 is collimated with the aid lens 30 and deflected by micro-mirror 10. Micro-mirror 10 is situated in a deflectable manner such that laser beam 25 is able to describe a line scan 60 on a projection surface 50.

Figure 2:
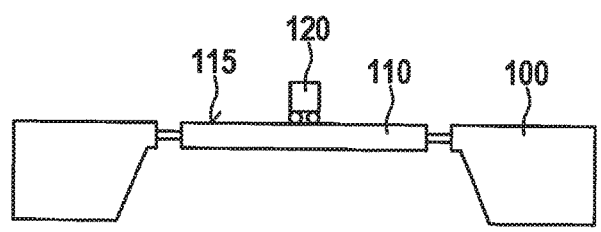
FIG. 2 shows a first micromechanical device according to the present invention having a movable element on which a laser is disposed.

FIG. 2 shows a first micromechanical device according to the present invention, which includes a deflectable element on which a laser is disposed. Schematically shown is a micromechanical device having a stationary element 100 and a deflectable element 110, which is suspended on stationary element 100. A light source 120 is situated on deflectable element 110. In this particular example, light source 120 is a VCSEL which is situated on a surface 115 of deflectable element 110. In the example, the VCSEL is fixed in place on surface 115 of deflectable element 110. However, as an alternative, it is also conceivable to integrate the VCSEL into deflectable element 110 with the aid of semiconductor manufacturing processes. Alternatively, some other light source 120, e.g., a semiconductor diode, may be provided as well.

Figure 3:
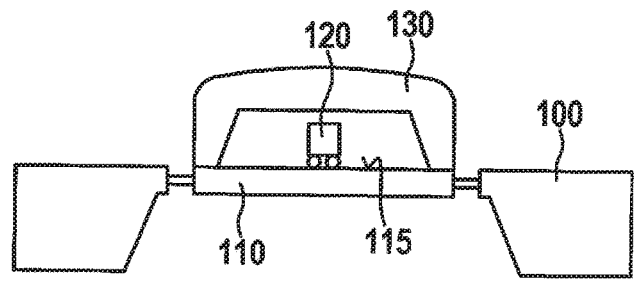
FIG. 3 shows a second micromechanical device according to the present invention having a movable element on which a laser is disposed and a lens.

FIG. 3 shows a second micromechanical device according to the present invention, which has a deflectable element including a laser that is disposed thereon and a lens. In addition to the exemplary embodiment according to FIG. 2, a lens 130 is situated in front of a light-exit opening of the VCSEL in this case. Lens 130 is fixed in place on surface 115 of deflectable element 110. Lens 130 is designed to collimate or focus laser beam 25.

Figure 4:
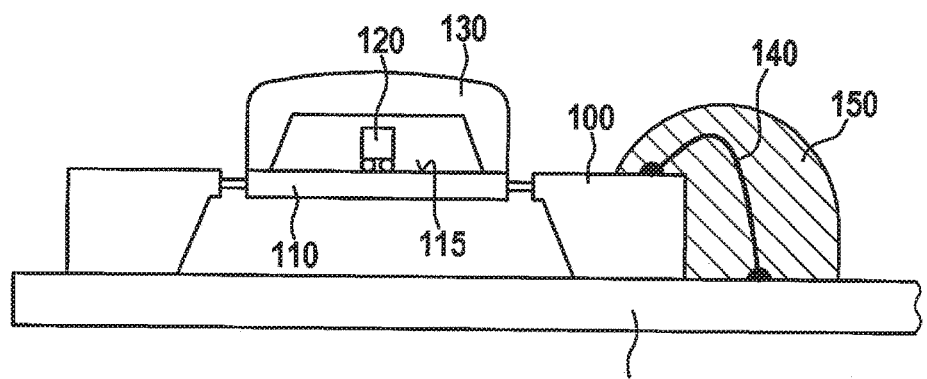
FIG. 4 shows a micromechanical scanner according to the present invention.

FIG. 4 shows a micromechanical scanner according to the present invention. Shown is a micromechanical device according to the present invention, which has a stationary element 100 and a deflectable element 110. A VCSEL 120 is disposed on a surface 115 of deflectable element 110. A lens 130 is disposed above a light-exit surface of VCSEL 120, Lens 130 is fixed in place on surface 115. The micromechanical device according to the present invention is situated on a substrate 160. Substrate 160, for instance, may be a circuit board or the like. The micromechanical device is connected to substrate 160 in an electrically conductive manner by means of wire bonds 140. Wire bonds 140 are enveloped by a passivation 150. The micromechanical device is electrically conductively connected to substrate 160 in such a way that electrical triggering of a deflection of deflectable element 110 as well as light source 120 in the form of the VCSEL is able to take place. Using a deflectable element 110 that is deflectable in a first direction thereby creates a 1D scanner. Employing a deflectable element 110 that is deflectable in a first and in a second direction, the first and the second direction differing from each other, thereby produces a 2D scanner.

LIST OF REFERENCE NUMERALS 10 micro-mirror
20 laser
25 laser beam
30 lens
40 housing
50 projection surface
60 line scan
100 stationary element
110 deflectable element
115 surface of the deflectable element
120 light source
130 micro lens
140 wire bond
150 passivation
160 substrate

What is claimed is:

1. A micromechanical device, comprising:
   a stationary element;
   a deflectable element suspended from the stationary element by at least one spring; and
   a light source situated on the deflectable element,
   wherein the deflectable element and light source are configured to be deflected together to scan light from the light source along at least one direction.

2. The micromechanical device as recited in claim 1, wherein the light source is a semiconductor light source.

3. The micromechanical device as recited in claim 2, wherein the semiconductor light source includes one of a light-emitting diode and a semiconductor laser.

4. The micromechanical device as recited in claim 1, further comprising:
   a lens situated in front of a light-exit point of the light source, wherein the lens is fixedly disposed relative to the light source.

5. A micromechanical scanner, comprising:
   a micromechanical device that includes:
      a stationary element,
      a deflectable element suspended from the stationary element by at least one spring, and
      a light source situated on the deflectable element,
      wherein the deflectable element and light source are configured to be deflected together to scan light from the light source along at least one direction.

6. The micromechanical scanner as recited in claim 5, wherein the light source is a semiconductor light source.

7. The micromechanical scanner as recited in claim 6, wherein the semiconductor light source includes one of a light-emitting diode and a semiconductor laser.

8. The micromechanical scanner as recited in claim 5, wherein the deflectable element is a plate.

9. The micromechanical scanner as recited in claim 5, wherein the light source is fixed on a surface of the deflectable element.

10. The micromechanical scanner as recited in claim 5, wherein the light source is integrated into the deflectable element using a semiconductor manufacturing process.

11. The micromechanical scanner as recited in claim 5, further comprising:
    a lens attached to a surface of the deflectable element.

12. The micromechanical device as recited in claim 1, wherein the deflectable element is a plate.

13. The micromechanical device as recited in claim 1, wherein the light source is fixed on a surface of the deflectable element.

14. The micromechanical device as recited in claim 1, wherein the light source is integrated into the deflectable element using a semiconductor manufacturing process.

15. The micromechanical device as recited in claim 1, further comprising:
    a lens attached to a surface of the deflectable element.

16. The micromechanical device as recited in claim 1, wherein the deflectable element and light source are configured to be deflected together to scan light from the light source along two different directions.

17. The micromechanical device as recited in claim 1, wherein the spring is connected at a first end to the deflectable element and at a second end to the stationary element.

18. The micromechanical scanner as recited in claim 5, wherein the deflectable element and light source are configured to be deflected together to scan light from the light source along two different directions.

19. The micromechanical scanner as recited in claim 5, wherein the spring is connected at a first end to the deflectable element and at a second end to the stationary element.

20. The micromechanical scanner as recited in claim 5, wherein the micromechanical device is situated on a substrate and is electrically conductively connected to the substrate in such a way that electrical triggering of the deflection of the deflectable element and the light source together is enabled.

21. The micromechanical scanner as recited in claim 20, wherein the substrate is a circuit board.

22. The micromechanical scanner as recited in claim 5, wherein the micromechanical device is a microelectromechanical system (MEMS), and the deflectable element is a deflectable MEMS plate.

23. The micromechanical scanner as recited in claim 22, further comprising a lens attached to a surface to the deflectable MEMS plate.

24. The micromechanical scanner as recited in claim 22, wherein the light source is a VCSEL.

25. The micromechanical scanner as recited in claim 24, wherein the VCSEL is fixed in place on a surface of the deflectable MEMS plate.

26. The micromechanical scanner as recited in claim 24, wherein the VCSEL is integrated into the deflectable MEMS plate with the aid of a semiconductor manufacturing process.

27. The micromechanical device as recited in claim 1, wherein the micromechanical device is a microelectromechanical system (MEMS), and the deflectable element is a MEMS plate.

* * * * *